United States Patent [19]

Fam

[11] Patent Number: 4,810,954
[45] Date of Patent: Mar. 7, 1989

[54] POYNTING VECTOR PROBE FOR MEASURING ELECTRICAL POWER

[75] Inventor: Wagih Z. Fam, Halifax, Canada

[73] Assignee: Canadian Patents & Development Ltd., Ottawa, Canada

[21] Appl. No.: 112,080

[22] Filed: Oct. 26, 1987

[30] Foreign Application Priority Data

Dec. 15, 1986 [CA] Canada .................................. 525371

[51] Int. Cl.⁴ ...................... G01R 21/06; G01R 15/00
[52] U.S. Cl. ...................................... 324/142; 324/126
[58] Field of Search .............. 324/142, 126, 127, 72.5, 324/133; 364/483

[56] References Cited

U.S. PATENT DOCUMENTS

| | | | |
|---|---|---|---|
| 3,396,339 | 8/1968 | Miram | 324/126 |
| 4,052,665 | 10/1977 | Gruenwald | 324/126 |
| 4,052,668 | 10/1977 | Schmitt et al. | 324/126 |
| 4,074,193 | 2/1978 | Kohler | 324/127 |
| 4,354,154 | 10/1982 | Schiemann | 324/127 |

*Primary Examiner*—Ernest F. Karlsen
*Attorney, Agent, or Firm*—Yoshiharu Toyooka

[57] ABSTRACT

A new probe for measuring electric power flow from a source of supply to a load at high voltage and current, but at extremely low power factor is disclosed. The probe enables the direct measurement of electric power, in accordance with the Poynting theorem, by sensing the electric and magnetic fields associated with the high voltage and high current.

7 Claims, 2 Drawing Sheets

POYNTING VECTOR PROBE FOR MEASURING ELECTRICAL POWER

FIELD OF THE PRESENT INVENTION

The present invention relates generally to an apparatus for and a method of measuring the power flow from a source of ac power to a load. In particular the present invention is directed to the ac power measurement wherein a Poynting vector is measured from the electric and magnetic fields generated in the space between coaxial conductors carrying the ac power.

BACKGROUND OF THE PRESENT INVENTION

Many techniques have been proposed and practised for measuring the electric power being supplied to a load. One type of metering apparatus is shown in U.S. Pat. No. 2,269,225 Jan. 6, 1942 (Rich). The patent describes a clamp-on type current sensor and a hook-on reistance type voltage sensor to measure voltage, current and reactive power of an overhead high voltage transmission line.

U.S. Pat. No. 4,348,638 Sept. 7, 1982 (Baldridge, Jr.) measures the current flowing into the load by means of a transformer secondary winding toroidally wrapped around one of the two parallel mains. No considerations are given to the Poynting vector.

The Poynting vector has been suggested for the measurement of energy transfer in electromagnetic devices. Thus in an article authored by the inventor of the present application, "Measurement of Losses in Saturated Solid Magnetic Cores", IEEE Trans. on Magnetics, Vol. MAG-7, No. 1, March 1971, pp 198–201, a new method of measuring the losses in saturated solid magnetic cores subjected to alternating magnetization is described. The method is based on the measurement of an alternative Poynting vector in the region between the surface of the iron core and the magnetizing winding. The two constituents of this power-flow vector are the partial electric field and the magnetic field.

In an article also authored by the present inventor, "Direct Measurement of the Fundamental and Harmonic Tooth-Ripple Losses in Solid Poles, Part II: Experimental investigation" IEEE Trans on Power Apparatus and Systems, Vol. PAS-90, No. 2, March/April 1971, pp 602–610, the experimental results of power flow measurements in the air gap of a salient-pole synchronous machine at no-load in the rotor references frame are reported. Suitable probes for measuring the electric and magnetic field componentsin the air gap of the machine are described together with the associated electric circuits. This technique has enabled the direct measurement of the tooth-ripple loss due to each individual harmonic in an ordinary machine and under actual running conditions where all the harmonics are simultaneously present. In another article by W. Z. Fam et al, "On the Measurement of Tooth-Rippled Losses in Laminated Poles" IEEE Trans. on Instrumentation and Measurement, Vol. IM-22, No. 1, March 1973, pp. 88–92, the method was applied to loss measurement in laminated poles.

Still another way of measuring the power is discussed in an article, "A Frequency-Compensated High-Voltage Current-Comparator-based Capacitance Bridge for Shunt Reactor Loss Measurement" by E. So, IEEE Trans on Instrumentation and Measurement, Vol IM-31, pp 46–49, March 1982. In this article, the power is determined by measuring the complementary phase angle $\delta$ using a modified current-comparator-based compacitance bridge. However, this method is very complex and is not a direct measurement of electric power requiring several expensive high precision components such as compressed-gas high-voltage capacitor, current-comparator etc.

Unlike prior art devices known to the inventor, some of which are described above, the present invention permits the direct measurement of electric power supplied by a source of power to a load. The probe to carry out the present method is very compact, simple and inexpensive to manufacture.

OBJECTS OF THE PRESENT INVENTION

It is an object of the present invention to make the direct electric power measurement possible at high voltage, high current and low power factor.

It is another object of the present invention to provide a probe for carrying out the direct electric power measurement which is compact, simple and inexpensive to manufacture.

SUMMARY OF THE PRESENT INVENTION

Briefly stated, a Poynting vector probe of the present invention includes a cylindrical outer conductor and a cylindrical inner conductor located coaxially with an inside the outer conductor. The inner and outer conductors form an annular space between them and transmit the electric power from a power source to a load. The Poynting vector probe further includes a cylindrical electrode assembly and a toroidal coil assembly, both located coaxially in the space between cylindrical conductors but axially adjacent to each other. The electrode assembly produces an electric current signal in response to the electric field generated in the space and the toroidal coil assembly produces an electric voltage signal in response to the magnetic field in the space. Signal processing means are electrically connected to the electrode assembly and the coil assembly to process the electric current and voltage signals to generate an output signal proportional to the power being supplied to the load.

The present invention also relates to a method of measuring the electric power being supplied by a power source to a load. The method includes a step of transmitting the electric power through mutually coaxial cylindrical inner and outer conductors. The method further includes steps of producing an electric current signal responsive to the electric field generated in an annular space between the conductors and producing an electric voltage signal responsive to the magnetic field generated in the space. There is provided another step of processing the electric current and voltage singals to produce an output signal proportional to the power being supplied to the load.

BRIEF DESCRIPTION OF THE DRAWINGS

For more complete understanding of the present invention and for further objects and advantages thereof, references may be made to the following description taken in conjunction with the accompanying drawing in which.

DETAILED DESCRIPTION OF THE PREFERRED EMBODIMENTS OF THE PRESENT INVENTION

Figure 1:
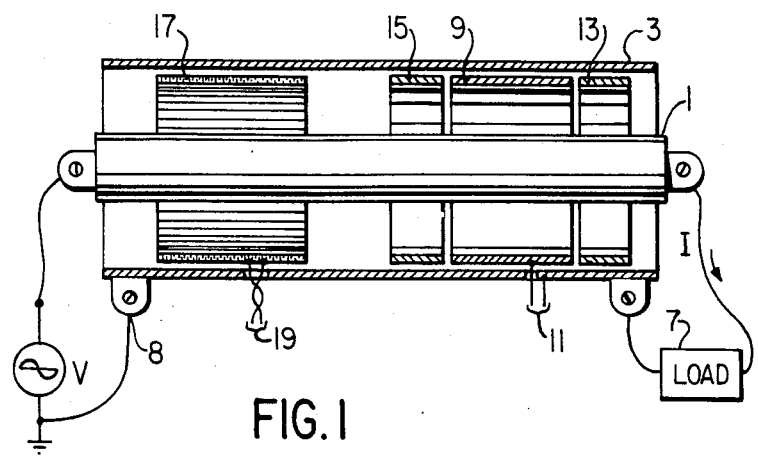
FIG. 1 is a schematic and partly cross-sectional view of the Poynting vector probe according to the present invention.

FIG. 1 is a schematic cross sectional view of the Poynting vector probe according to the present invention. The probe includes a cylindrical inner conductor 1 and a cylindrical outer conductor 3 in a coaxial configuration to transmit electrical power. On one side, these coaxial conductors are connected to the source of ac power supply 5 and on the other side, they are connected to the low power-factor load 7 in which the electric power to be measured is dissipated. The outer conductor 3 is grounded through the terminal 8. In the annular space between the two coaxial conductors, a cylindrical electrode 9 of a thin conducting material is mounted coaxially with the outer conductor 3 and inner conductor 1. The cylindrical electrode 9 is designed to fit inside but very close to the grounded outer conductor 3.

The cylindrical electrode 9 measures the time-varying electric field generated in the annular space when the power is being transmitted through the coaxial inner and outer conductors 1 and 3. An electrical current signal responsive to the electric field and proportional to $\alpha V/\alpha t$, where V is the voltage applied between the-conductors, is obtained through leads 11. To reduce the effect of fringing of the electric field near the edges, two guard rings 13 and 15 are mounted, one on each side of the cylindrical electrode 9 and separated from it by a thin insulating spacer (not shown). The guard rings are of the same diameter as that of the cylindrical electrode 9 and are located coaxially therewith.

The probe further includes a toroidal coil 17 which is located in the annular space coaxially with the inner and the outer conductors 1 and 3. This coil 17 senses the time-varying magnetic field generated in the space by the load current I shown in the figure. An electric voltage signal responsive to the magnetic field and proportional to $\partial I/\partial t$, where I is the load current, is obtained through leads 19.

Figure 2:
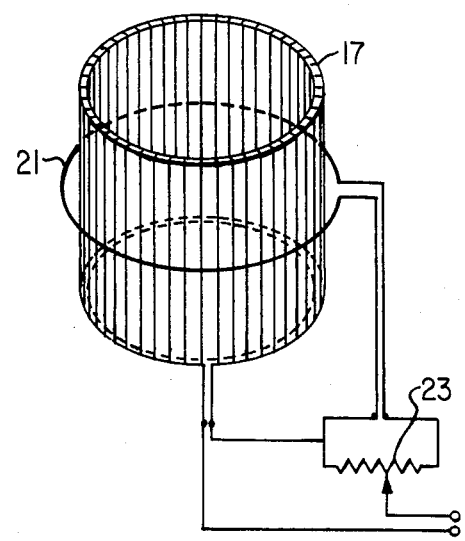
FIG. 2 is a prespective view of a toroidal coil assembly according to the present invention.

FIG. 2 shows perspectively the toroidal coil 17 which has many turns of thin copper wire wound on an insultating cylinder with small radial thickness. The coil 17 is of about the same diameter as that of the cylindrical electrode 9. The coil is located in the annular space coaxially with the inner and the outer conductors 1 and 3.

In case there are spurious external magnetic fields which might interfere with the measurements, the toroidal coil 17 can be made immune against such external axial magnetic fields by adding a compensating turn 21 connected to a potentiometer 23 of e.g. 1 ↓ Ω as shown in the figure.

The compensation is set in a separate test where the coil is placed in an axial time-varying magnetic field, and a portion of the e.m.f. induced in the compensating turn 19 (selected by adjusting the potentiometer 23) is fed in opposition to the e.m.f. induced in the toroidal coil 17 until the total signal is zero. A similar idea may be used to compensate the toroidal coil 17 against any spurious external radial magnetic fields which might exist.

In the annular space between the coaxial inner and outer conductors 1 and 3, the applied high voltage V will produce an electric field E in the radial direction. The current I supplied to the load 7 will produce a magnetic field H in the tangential direction. The Poynting vector S, which represents the flow of electromagnetic energy from the supply 5 to the load 7 is given by the vector product of E and H:

$$\vec{S} = \vec{E} \times \vec{H}.$$

At any radius r, in the annular space, the electric field intensity is $$Er = \frac{V}{r \ln \frac{R_2}{R_1}}$$

where $R_2$ and $R_1$ are the radius of the outer and inner coaxial conductors 3 and 1 respectively. The cylindrical electrode 9 measures this electric field near the outer conductor 3.

Similarly, at any radius r, in the annular space, the magnetic field intensity is $$H_\theta = \frac{I}{2\pi r}$$

This magnetic field near the outer conductor is measured by the toroidal coil 17. The electric current signal from the cylindrical electrode and the electric voltage signal from the toroidal coil assembly must be electronically processed to generate an output signal which is indicative of the electric power.

Figure 3:
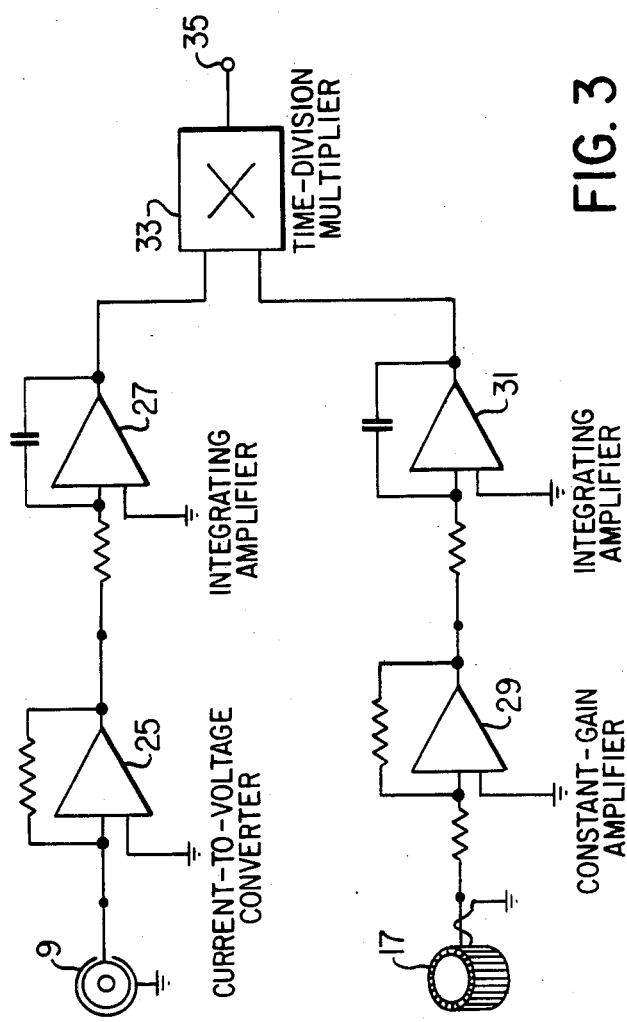
FIG. 3 is an electric circuit according to the present invention.

FIG. 3 shows an electronic circuit which can be used for processing the signals in one preferred embodiment of the present invention. In the figure, the electric current induced in the cylindrical electrode 9 by the time-varying electric field is converted to a voltage signal using a current-to-voltage operational amplifier circuit 25. This voltage signal is then integrated w.r.t. time using an operational amplifier integrating circuit 27. The e.m.f. induced in the toroidal coil 17 by the time-varying magnetic field is first amplified using a constant-gain instrumentation amplifier 29 and is then integrated w.r.t. time using an operational amplifier integrating circuit 31. The outputs from the two integrating circuits 27 and 31 are multiplied together using a time-division multiplier 33 whose dc output voltage 35 is a direct measure of the power supplied to the load.

I claim:
1. A Poynting vector probe for measuring the electric power being supplied by a power source to a load at high voltage, high current and low power factor, comprising:
   a cylindrical outer conductor;
   a cylindrical inner conductor located coaxially with and inside the said outer conductor and forminig an annular space with the said outer conductor therebetween;
   the said outer and the said inner conductors transmitting the electric power from the said source to the said load;
   a cylindrical electrode assembly coaxially located in the said space for producing an electric current signal in response to the electric field generated therein;
   a toroidal coil assembly coaxially located in the said space and axially adjacent to the said cylindrical electrode for producing an electric voltage signal in response to the magnetic field generated therein; and signal processing means electrically connected to the said cylindrical electrode assembly and the said toroidal coil assembly for processing the said electric current signal and the said electric voltage signal to produce an output signal proportional to the power being supplied to the said load.

2. The Poynting vector probe according to claim 1 wherein the said cylindrical electrode assembly further comprises:

an electrode cylinder designed to fit inside but close to the cylindrical outer conductor and being electrically connected to the said signal processing means;

a pair of guard rings designed to fit inside but close to the cylindrical outer conductor;

the said electrode cylinder and the pair of the guard rings being located coaxially with the outer conductor; and each of the pair of the guard rings being located on each side of the electrode cylinder but spaced apart therefrom.

3. The Poynting vector probe according to claim 1 wherein the said toroidal coil assembly includes a compensating turn.

4. The Poynting vector probe according to claim 2 wherein the said toroidal coil assembly includes a compensating turn.

5. The Poynting vector probe according to claim 1 wherein the said signal processing means comprises:

a current-to-voltage converter and a first integrating amplifier connected to the said cylindrical electrode assembly;

a constant-gain amplifier and a second integrating amplifier connected to the said toroidal coil assembly; and a time-division multiplier connected to the first and second integrating amplifiers to produce the said output.

6. A method of measuring the electric power being supplied by a power source to a load at high voltage, high current and low power factor, comprising steps of:

transmitting the said electric power through mutually coaxial cylindrical inner and outer conductors;

producing an electric current signal in response to the electric field generated in an annular space between the inner and outer conductors;

producing an electric voltage signal in response to the magnetic field generated in the said space; and processing the electric current signal and the electric voltage signal to produce an output signal proportional to the power being supplied to the load.

7. A method of measuring the electric power according to claim 6, wherein the step of producing the electric voltage signal further includes a step of:

producing a compensating voltage in response to external axial magnetic fields which may exist in the said space so that the said electric voltage is free from spurious noise by the axial magnetic fields.

* * * * *